(12) United States Patent
Man

(10) Patent No.: US 10,775,608 B2
(45) Date of Patent: Sep. 15, 2020

(54) ELECTROMAGNETIC ACTIVATED MIRROR ARRAY WITH FLUID DAMPING AND MICRO-FABRICATED RECESS FOR MAGNET ASSEMBLY

(71) Applicant: Futurewei Technologies, Inc., Plano, TX (US)

(72) Inventor: Francis Man, Lexington, MA (US)

(73) Assignee: Futurewei Technologies, Inc., Plano, TX (US)

(*) Notice: Subject to any disclaimer, the term of this patent is extended or adjusted under 35 U.S.C. 154(b) by 120 days.

(21) Appl. No.: 16/057,198

(22) Filed: Aug. 7, 2018

(65) Prior Publication Data

US 2019/0049717 A1 Feb. 14, 2019

Related U.S. Application Data

(60) Provisional application No. 62/543,230, filed on Aug. 9, 2017.

(51) Int. Cl.
*G02B 26/08* (2006.01)
*G02B 26/10* (2006.01)
*B81B 7/00* (2006.01)

(52) U.S. Cl.
CPC ........ *G02B 26/0833* (2013.01); *B81B 7/0058* (2013.01); *G02B 26/085* (2013.01); *G02B 26/101* (2013.01); *B81B 2201/042* (2013.01)

(58) Field of Classification Search
CPC .............. G02B 26/0833; G02B 26/085; G02B 26/101; G02B 26/004; G02B 26/005; G02B 26/007; G02B 26/0825; G02B 26/0866; B81B 7/0058; B81B 2201/042

USPC ........................................................ 359/224.1
See application file for complete search history.

(56) References Cited

U.S. PATENT DOCUMENTS

| | | | |
|---|---|---|---|
| 2002/0158547 A1* | 10/2002 | Wood ................... | B81B 3/0054 310/307 |
| 2004/0057103 A1 | 3/2004 | Bernstein | |
| 2005/0073736 A1* | 4/2005 | Guo ................... | G02B 26/0841 359/291 |
| 2005/0195464 A1 | 9/2005 | Faase et al. | |
| 2008/0179696 A1* | 7/2008 | Chen ................... | G02B 26/0833 257/415 |
| 2009/0109512 A1 | 4/2009 | Park | |

OTHER PUBLICATIONS

Foreign Communication from a Counterpart Application, PCT Application No. PCT/CN2018/099313, English Translation of International Search Report dated Oct. 25, 2018, 5 pages.

(Continued)

*Primary Examiner* — William R Alexander
*Assistant Examiner* — Henry A Duong
(74) *Attorney, Agent, or Firm* — Conley Rose, P.C.

(57) ABSTRACT

A MEMS package includes a cavity formed within a package body, a semiconductor device disposed within the cavity and including a microelectromechanical systems (MEMS) micro-mirror, a damping fluid disposed within the cavity and at least partially surrounding a portion of the MEMS micro-mirror, and a magnet assembly disposed within the cavity and at least partially surrounded by the damping fluid, the magnet assembly being magnetically coupled with the MEMS micro-mirror.

18 Claims, 4 Drawing Sheets

(56) References Cited

OTHER PUBLICATIONS

Foreign Communication from a Counterpart Application, PCT Application No. PCT/CN2018/099313, English Translation of Written Opinion dated Oct. 25, 2018, 5 pages.
Asada, et al., "Silicon Micromachined Two-Dimensional Galvano Optical Scanner," IEEE Transactions on Magnetics, vol. 30, No. 6, Nov. 1994, pp. 4647-4649.
Uchino, et al., "Capactive Feedback Controlled PZT Micro Mirror Arrays for Wavelength Selective Switch," MEMS 2014, San Francisco, CA, USA, Jan. 26-30, 2014, pp. 1155-1158.
Burns, et al., "Electromagnetically Driven Integrated 3D MEMS Mirrors for Large Scale PXCs," National Fiber Optic Engineers Conference, 18th Annual, Technical Proceedings, 2002, pp. 2174-2183.
Bernstein, et al., "Electromagnetically Actuated Mirror Arrays for Use in 3-D Optical Switching Applications," Journal of Microelectromechanical Systems, vol. 13, No. 3, Jun. 2004, pp. 526-535.

\* cited by examiner

ELECTROMAGNETIC ACTIVATED MIRROR ARRAY WITH FLUID DAMPING AND MICRO-FABRICATED RECESS FOR MAGNET ASSEMBLY

CROSS-REFERENCE TO RELATED APPLICATIONS

This patent application claims the benefit of U.S. Provisional Patent Application No. 62/543,230, filed Aug. 9, 2017, by Francis Man and titled "Electromagnetic Activated Mirror Array With Fluid Damping And Micro-Fabricated Recess For Magnet Assembly," the teaching and disclosure of which is hereby incorporated in its entirety by reference thereto.

BACKGROUND

Microelectromechanical systems (MEMS) micro-mirror arrays, which include a plurality of MEMS micro-mirrors, have many optical (e.g., light) modulation applications. MEMS micro-mirror arrays may be used as optical switches, optical attenuators, and optical tunable filters in fiber optic networks. MEMS micro-mirrors may be used as optical cross-connection (OXC) switches in a two dimensional array.

SUMMARY

In an embodiment, a MEMS package provides a cavity formed within a package body, a semiconductor device disposed within the cavity and including a microelectromechanical systems (MEMS) micro-mirror, a damping fluid disposed within the cavity and at least partially surrounding a portion of the MEMS micro-mirror, and a magnet assembly disposed within the cavity and at least partially surrounded by the damping fluid, the magnet assembly being magnetically coupled with the MEMS micro-mirror.

Optionally, another implementation of the aspect provides that the MEMS micro-mirror is in the form of a MEMS micro-mirror array that includes a plurality of MEMS micro-mirrors. Optionally, in any of the preceding aspects, another implementation of the aspect provides that the magnet assembly is disposed within a recess formed in the chip, and wherein the recess is formed in a bottom surface of the chip. Optionally, in any of the preceding aspects, another implementation of the aspect provides that the damping fluid is pressurized within the cavity, and wherein a pressure within the cavity is between about 1 atmosphere and about 5 atmospheres. Optionally, in any of the preceding aspects, another implementation of the aspect provides that a pressure within the cavity is below an atmospheric pressure. Optionally, in any of the preceding aspects, another implementation of the aspect provides that the damping fluid can be sulfur hexafluoride (SF6), an inert gas (such as neon (Ne), nitrogen ($N_2$), argon (Ar), or xenon (Xe) or a combination thereof), a hydrocarbon oil, heptane, a lubricant, or Fomblin pump oil. The hydrocarbon oil can be an optical grade oil with reflective index ranging from about 1.4 to about 1.7. The hydrocarbon oil can be an optical grade oil with viscosity ranging from about 1 to about 100 centistokes (cTs). The hydrocarbon oil can be optically transparent to laser commonly used in optical communication with wavelength of about 1550 nm. Optionally, in any of the preceding aspects, another implementation of the aspect provides that a cap covering an opening of the cavity is seated in a recess in a top surface of the package. Optionally, in any of the preceding aspects, another implementation of the aspect provides that the package includes a cap covering an opening of the cavity, and wherein the cap is bonded to an upper surface of the chip with a bonding material. Optionally, in any of the preceding aspects, another implementation of the aspect provides that electrode pads of the MEMS micro-mirror are electrically coupled to electrode pads of the package.

In an embodiment, the disclosure provides a MEMS package including a cavity formed within a package body, a semiconductor device disposed within the cavity and including a microelectromechanical systems (MEMS) micro-mirror, a damping fluid disposed within the cavity and at least partially surrounding a portion of the MEMS micro-mirror, and a magnet assembly disposed within the cavity, the magnet assembly seated within a recess in a bottom portion of the semiconductor device, at least partially surrounded by the damping fluid, and magnetically coupled with the MEMS micro-mirror.

Optionally, in any of the preceding aspects, another implementation of the aspect provides that the damping fluid within the cavity is pressurized below one atmosphere. Optionally, in any of the preceding aspects, another implementation of the aspect provides that the MEMS micro-mirror is one of a plurality of MEMS micro-mirrors within a MEMS micro-mirror array. Optionally, in any of the preceding aspects, another implementation of the aspect provides that the cavity is sealed by securing a cap in place with a bonding material. Optionally, in any of the preceding aspects, another implementation of the aspect provides that the damping fluid is a liquid.

In an embodiment, the disclosure includes a method of mounting a magnet assembly. The method includes forming a recess in a chip containing a microelectromechanical systems (MEMS) micro-mirror and seating a magnet assembly within the recess of the chip.

Optionally, in any of the preceding aspects, another implementation of the aspect provides that the MEMS micro-mirror is one of a plurality of micro-mirrors within a MEMS micro-mirror array. Optionally, in any of the preceding aspects, another implementation of the aspect provides that the recess is formed in a bottom surface of the chip. Optionally, in any of the preceding aspects, another implementation of the aspect provides that the magnet assembly partially protrudes from the recess when seated within the recess. Optionally, in any of the preceding aspects, another implementation of the aspect provides that the chip and the magnet assembly are disposed within a cavity of a package. Optionally, in any of the preceding aspects, another implementation of the aspect provides inserting a damping fluid in the cavity of the package.

In an embodiment, the disclosure includes a method of damping a microelectromechanical systems (MEMS) micro-mirror. The method includes inserting a damping fluid into a cavity of a package containing the MEMS micro-mirror; and sealing the cavity. The damping fluid can be sulfur hexafluoride (SF6), an inert gas (such as neon (Ne), nitrogen ($N_2$), argon (Ar), or xenon (Xe)), a hydrocarbon oil, heptane, a lubricant, or Fomblin pump oil.

Optionally, in any of the preceding aspects, another implementation of the aspect provides pressurizing the damping fluid within the cavity. Optionally, in any of the preceding aspects, another implementation of the aspect provides that the MEMS micro-mirror is one of a plurality of MEMS micro-mirrors within a MEMS micro-mirror array. Optionally, in any of the preceding aspects, another implementation of the aspect provides that the cavity is sealed by securing a cap in place with a bonding material. Optionally, in any of the preceding aspects, another implementation of the aspect provides seating a magnet assembly in a recess in a bottom portion of a chip disposed within the cavity of the package and supporting the MEMS micro-mirror.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Desirable features for a MEMS mirror array include a large mirror tilting angle (e.g., greater than about ten degrees (>10°)) and a low actuation voltage (e.g., less than about ten volts (<10 V)). An example of a MEMS mirror array having these features is described in "Electromagnetically actuated mirror arrays for use in 3-D optical switching applications," by J. J. Bernstein, et al., Journal of Microelectromechanical Systems, Vol. 13, No. 3, June 2004, p. 526-535, which is incorporated herein by reference. However, these MEMS mirror arrays are susceptible to shock and vibration, which may lead to false optical switching or other undesirable effects.

Disclosed herein is a MEMS micro-mirror that utilizes fluid damping to mitigate shock and vibrations. The MEMS micro-mirror also has a micro-fabricated recess that ensures precise placement of a magnet assembly and a minimal distance between the magnet assembly and a mirror structure of the MEMS micro-mirror.

Figure 1:
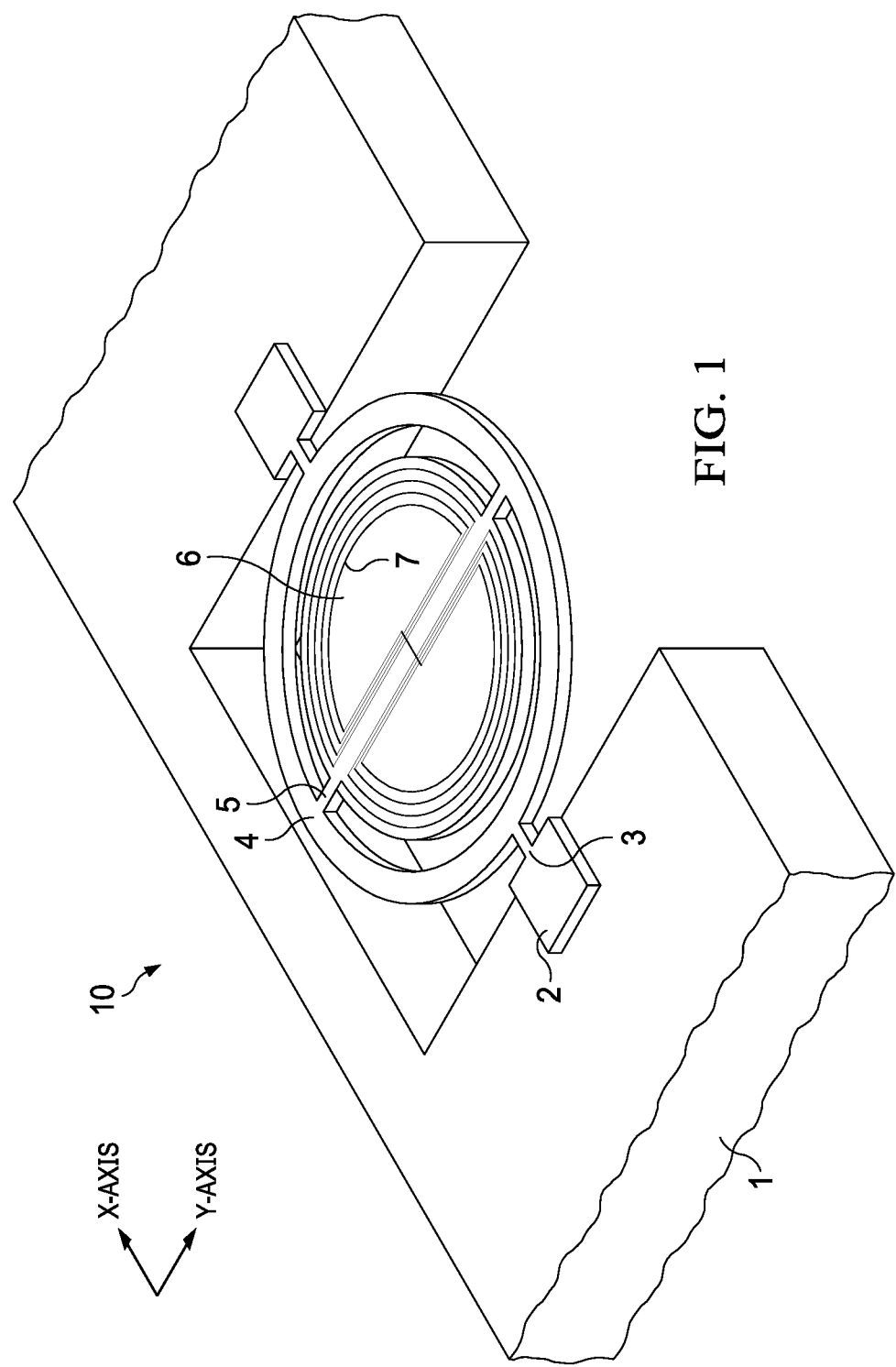
FIG. 1 is a schematic illustration of an embodiment of a MEMS micro-mirror.

FIG. 1 is a schematic illustration of an example of a MEMS micro-mirror 10 (also known in the industry as a "mirror device" or a "micro-fabricated mirror"). The MEMS micro-mirror 10 has a two dimensional (2D) reflective surface 6 such as a mirror containing at least one coil 7. The at least one coil 7 may be disposed on a surface of the mirror (e.g., the top and/or bottom surface) or integrated into the reflective surface 6, such as along the periphery of the reflective surface 6, as shown. The reflective surface 6 is pivotably mounted to a gimbal frame 4 by a pivot structure (e.g., flexure) 5. The gimbal frame 4 is pivotably mounted to a substrate 1 (partially cut away) by another pivot structure (e.g., flexure) 3 coupled to an electrode pad 2 secured to the substrate 1. The pivot structure 3 enables the gimble frame 4 to pivot about the x-axis, whereas the pivot structure 5 enables the reflective surface 6 to pivot about the y-axis. It should be understood that the MEMS micro-mirror 10 may have other features and components in practical applications.

Figure 2:
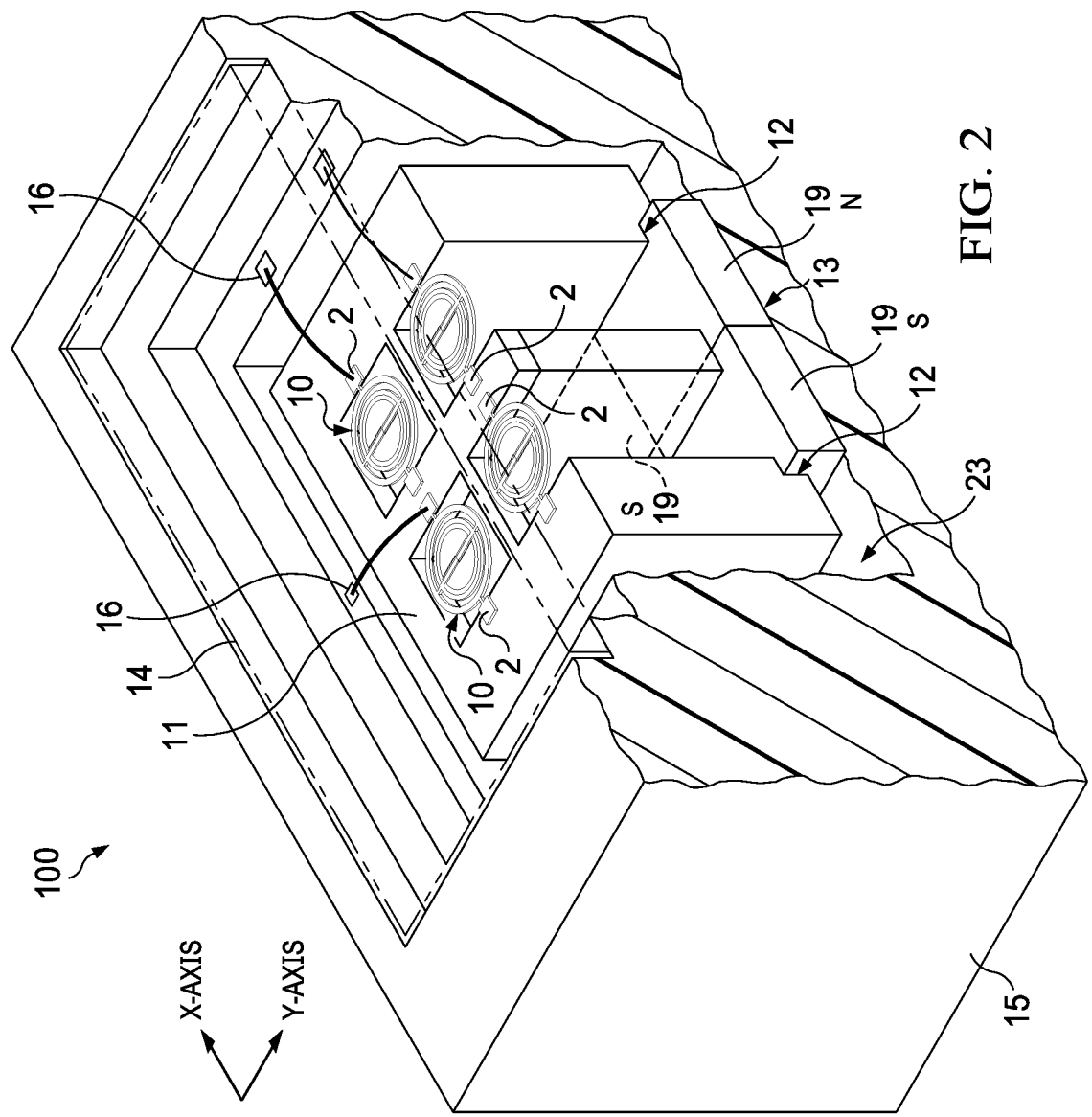
FIG. 2 is a schematic diagram of an embodiment of a package including a chip having an array of the MEMS micro-mirrors of FIG. 1.

FIG. 2 is a schematic diagram of a MEMS package, depicted generally by reference character 100. The MEMS package 100 includes a package body 15 that defines a cavity 23 therein. Received within the cavity is a semiconductor device 11 (also known in the industry as a "chip" or "semiconductor chip") having an array of MEMS micro-mirrors 10 of the type described above and illustrated in FIG. 1. Notably, a portion of the package 15 has been cut-away in FIG. 2 to better illustrate the internal structure of the package 15. While four of the MEMS micro-mirrors 10 of FIG. 1 are included in the semiconductor device 11 of FIG. 2, it should be appreciated that a greater or lesser number of MEMS micro-mirrors 10 may be included in semiconductor device 11 in practical applications. The MEMS micro-mirrors 10 in FIG. 2 may be electrically coupled to the electrode pads 16 disposed in the package 15 in order to transmit electrical signal measurements.

As shown, the semiconductor device 11 of FIG. 2 contains a micro-fabricated recess 12. In an embodiment, the micro-fabricated recess 12 is formed into a bottom surface or portion of the semiconductor device 11. The micro-fabricated recess 12 is configured to receive a magnet assembly 13. In an embodiment, the magnet assembly 13 protrudes from the micro-fabricated recess 12. In an embodiment, the magnet assembly 13 is seated within the recess 12 such that the magnet assembly 13 and the surrounding portions of the bottom surface of the semiconductor device 11 are flush with each other. In an embodiment, the magnet assembly 13 contains a plurality of individual magnets 19 having different polarities (e.g., either North (N) or South (S)). In an embodiment, the polarities of adjoining magnets 19 may be opposed. For example, as depicted in FIG. 2, the north pole (N) of one magnet 19 is oriented next to the south pole (S) of an adjoining magnet 19.

Because the magnet assembly 13 is seated in the semiconductor device 11, the distance between the magnets 19 in the magnet assembly 13 and the MEMS micro-mirrors 10 may be precisely controlled. In an embodiment, the distance between the magnets 19 and the MEMS micro-mirrors 10 is reduced or minimized to hundreds or even tenths of micron relative to the distance in conventional packages. As a consequence, the magnetic field strength the magnets 19 on the MEMS micro-mirrors 10 in the semiconductor device 11 may be optimized. Thus, magnetic actuation of the micro-mirrors 10 is improved.

In an embodiment, the MEMS micro-mirrors 10 are encapsulated within a cavity 23 of the package 15 by a cap 14 such as a slide seated in a recess in a top surface of the package 15. In an embodiment, the cap 14 is formed from glass, plastic, or another suitable encapsulating structure. In an embodiment, the cap is transparent to visible light or infrared (e.g., 1550 nanometers (nm)) for purposes of reflecting off the reflective surface 6 of the MEMS micro-mirror. In an embodiment, the cavity 23 is filled with a liquid or gaseous fluid to provide damping due to fluid viscosity and mitigate the effects of shock and vibration on the MEMS micro-mirrors 10. In an embodiment, the damping fluid utilized is not corrosive or harmful to electronic circuitry such as the MEMS micro-mirrors 10 or the electrode pads 2, 16. In an embodiment, the fluid may be a gas such as, for example, sulfur hexafluoride (SF6), an inert gas such as neon (Ne), nitrogen ($N_2$), argon (Ar), or xenon (Xe). In an embodiment, the fluid may be a liquid such as, for example, a hydrocarbon oil, heptane, a lubricant, or Fomblin pump oil. In an embodiment, the cavity 23 containing damping fluid may be sealed and pressurized ranging from about one to about five atmosphere (atm). In an embodiment, the pressure within the cavity 23 may be below one atmosphere.

Figure 3:
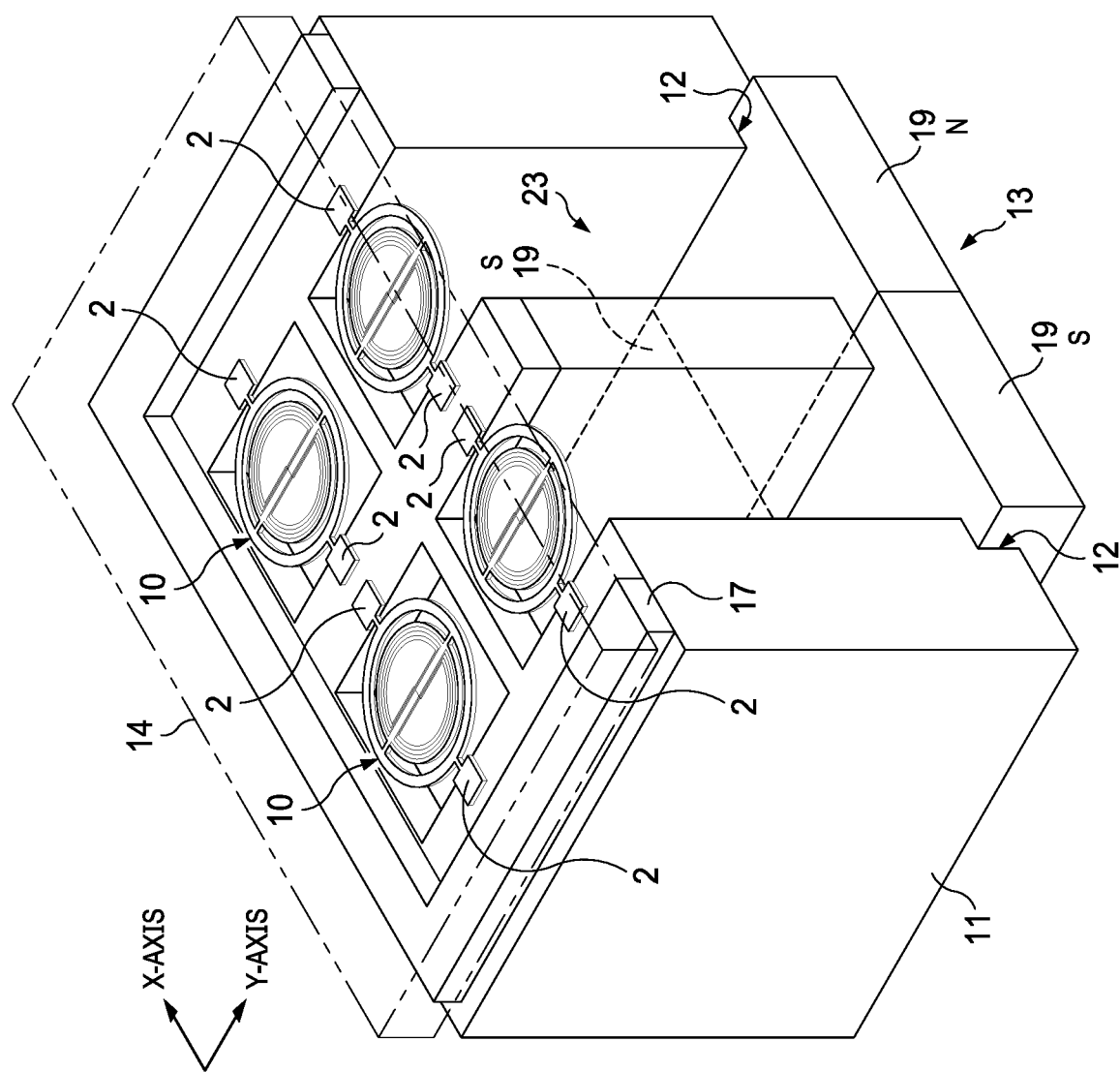
FIG. 3 is a schematic diagram of an embodiment of a chip having an array of the MEMS micro-mirrors of FIG. 1.

FIG. 3 is a schematic diagram of a semiconductor device 11 having an array of the MEMS micro-mirrors 10. The semiconductor device 11 of FIG. 3 is similar to the semiconductor device 11 of FIG. 2. However, in contrast to FIG. 2, the cap 14 in FIG. 3 has been bonded to an upper surface of the semiconductor device 11 using a layer of bonding material 17. The bonding material could be, but is not limited to, aluminum germanium alloy, copper, gold, indium, tin, lead, silver, or any combination or alloy thereof. In an embodiment, the bonding material 17 forms a hermetic seal. Thereafter, the cavity 23 within the package 15 (which is not shown in FIG. 3) is filled with a fluid to provide damping and mitigate the effects of shock and vibration on the MEMS micro-mirrors 10.

Figure 4:
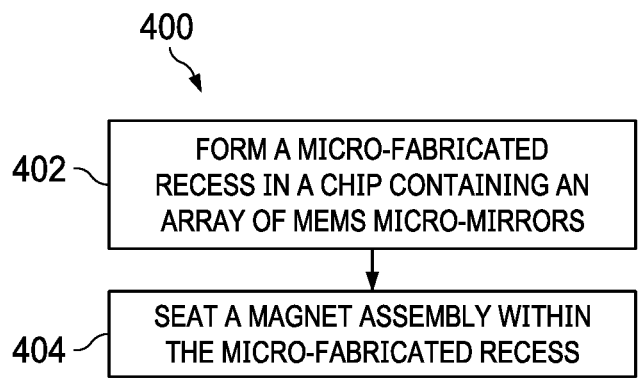
FIG. 4 is an embodiment of a method of mounting a magnet assembly in a chip.

FIG. 4 is a method 400 of mounting a magnet assembly in a chip such as, for example, the magnet assembly 13 and semiconductor device 11 of FIGS. 2-3. In block 402, a recess 12 is formed in a semiconductor device 11 containing an array of MEMS micro-mirrors 10. In an embodiment, the recess 12 is formed using a micro-fabrication technique such as deep reactive ion etching or wet etching (e.g., potassium hydroxide). In an embodiment, the micro-fabricated recess 12 is formed in a bottom surface of the semiconductor device 11. The micro-fabricated recess 12 is sized and configured to receive the magnet assembly 13. Thus, the micro-fabricated recess 12 may form a shoulder-like structure in the semiconductor device 11 as shown in FIGS. 2-3.

In block 404, the magnet assembly 13 is seated within the micro-fabricated recess 12. Because the magnet assembly 13 is formed into the semiconductor device 11, the distance between the magnets 19 in the magnet assembly 13 and the MEMS micro-mirrors 10 may be precisely controlled. In an embodiment, the distance between the magnets 19 and the MEMS micro-mirrors 10 is reduced or minimized relative to the distance in conventional packages. In light of these benefits, the magnetic effect of the magnets 19 on the MEMS micro-mirrors 10 in the semiconductor device 11 may be optimized. Thus, magnetic actuation is improved. In an embodiment, the semiconductor device 11 may be incorporated into the package 15 of FIG. 2 after the magnet assembly 13 has been suitably mounted. Thereafter, fluid may be inserted into the cavity 23 within the package 15 to provide the damping or shock mitigation as described above.

Figure 5:
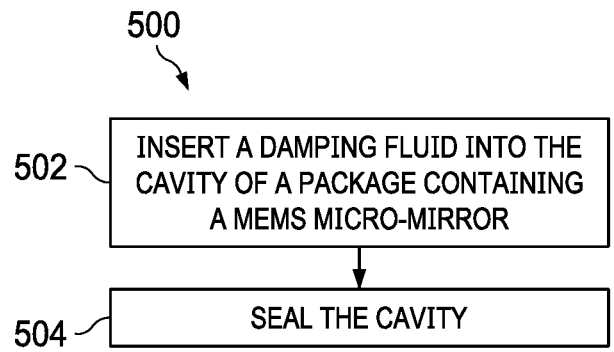
FIG. 5 is an embodiment of a method of damping a MEMS micro-mirror.

FIG. 5 is a method 500 of damping a MEMS micro-mirror such as the MEMS micro-mirrors 10 of FIGS. 1-3. In block 502, a damping fluid is inserted into the cavity 23 of the package 15 containing the MEMS micro-mirror 10. In an embodiment, cavity 23 of the package 15 includes the empty space within the semiconductor device 11. In an embodiment, the MEMS micro mirror 10 is one of a plurality of micro-mirrors within a MEMS micro-mirror array.

In block 504, the cavity 23 is sealed or otherwise closed. In an embodiment, the cap 14 is used to seal the opening of the cavity 23 and pressurized to maintain the damping fluid at a desired pressure, such as below 1 atmosphere (atm) or in the range of about 1 atm to about 5 atm, depending upon the damping fluid employed and the overall damping effect desired. Optionally, the bonding material 17 may be used to secure the cap 14 in place. The cap 14 can be secured to the semiconductor device 11 in any suitable, conventional manner, including along a recessed channel formed below the top surface of the chip. With the damping fluid disposed in the cavity 23, the effects of shock and vibration on the MEMS micro-mirrors 10 are mitigated or eliminated.

Figure 6:
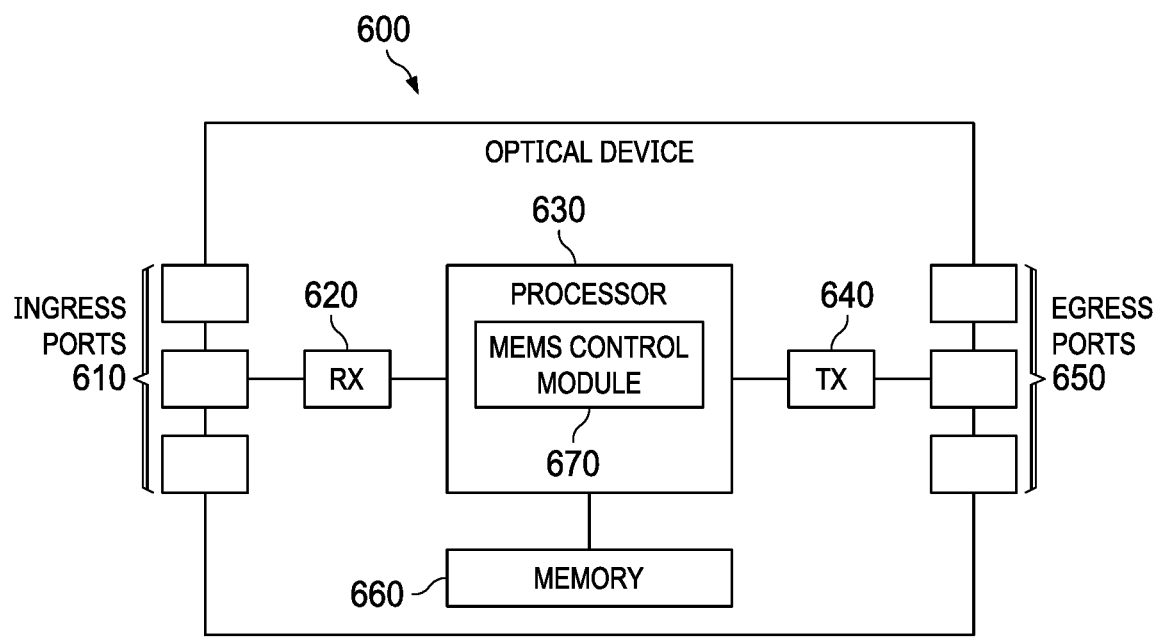
FIG. 6 is a schematic diagram of an embodiment of an optical device.

FIG. 6 is a schematic diagram of an optical device 600 according to an embodiment of the disclosure. The embodiments as described herein may be incorporated into or work in conjunction with the optical device 600. The optical device 600 comprises ingress ports 610 and at least one receiver unit (Rx) 620 for receiving data; a processor, logic unit, or central processing unit (CPU) 630 to process the data; at least one transmitter unit (Tx) 640 and egress ports 650 for transmitting the data; and a memory 660 for storing the data. The optical device 600 may also include one or more optical-to-electrical (OE) components (not shown) and electrical-to-optical (EO) components (not shown) coupled to the ingress ports 610, the receiver units 620, the transmitter units 640, and the egress ports 650 for egress or ingress of optical or electrical signals.

The processor 630 is implemented by hardware and software. The processor 630 may be implemented as one or more CPU chips, cores (e.g., as a multi-core processor), field-programmable gate arrays (FPGAs), application specific integrated circuits (ASICs), and digital signal processors (DSPs). The processor 630 is in communication with the ingress ports 610, receiver units 620, transmitter units 640, egress ports 650, and memory 660. The processor 630 comprises a MEMS control module 670. The MEMS control module 670 implements functions and procedures corresponding to, for example, the MEMS micro-mirrors 10. For instance, the MEMS control module 670 implements, processes, prepares, or provides the various functions of the MEMS micro-mirrors 10 or the array of the MEMS micro-mirrors 10. The inclusion of the MEMS control module 670 therefore provides a substantial improvement to the functionality of the optical device 600 and effects a transformation of the optical device 600 to a different state. Alternatively, the MEMS control module 670 is implemented as instructions stored in the memory 660 and executed by the processor 630.

The memory 660 can be in the form of one or more disks, tape drives, and solid-state drives or flash memory and may be used as an over-flow data storage device, to store programs when such programs are selected for execution, and to store instructions and data that are read during program execution. The memory 660 may be volatile and/or non-volatile and may be read-only memory (ROM), random access memory (RAM), ternary content-addressable memory (TCAM), and/or static random-access memory (SRAM).

In an embodiment, the disclosure includes a package means. The package means includes a cavity, a chip means disposed within the cavity, the chip means including a microelectromechanical systems (MEMS) micro-mirror means, a magnet assembly means disposed within the cavity, the magnet assembly magnetically coupled with the MEMS micro-mirror, and a damping fluid means disposed within the cavity.

In an embodiment, the disclosure provides a method of mounting a magnet assembly means. The method includes forming a recess in a chip means containing a microelectromechanical systems (MEMS) micro-mirror means; and seating a magnet assembly means within the recess of the chip means.

In an embodiment, the disclosure provides a method of damping a microelectromechanical systems (MEMS) micro-mirror means. The method includes inserting a damping means into a cavity of a package means containing the MEMS micro-mirror means, and sealing the cavity.

While several embodiments have been provided in the present disclosure, it should be understood that the disclosed systems and methods can be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A MEMS package, comprising:
   a cavity formed within a package body;
   a semiconductor device disposed within the cavity and including a microelectromechanical systems (MEMS) micro-mirror;
   a damping fluid disposed within the cavity and at least partially surrounding a portion of the MEMS micro-mirror; and
   a magnet assembly disposed within the cavity and at least partially surrounded by the damping fluid, the magnet assembly being magnetically coupled with the MEMS micro-mirror.

2. The MEMS package of claim 1, wherein the MEMS micro-mirror is one of a plurality of micro-mirrors within a MEMS micro-mirror array.

3. The MEMS package of claim 1, wherein the magnet assembly is disposed within a recess formed in the semiconductor device, and wherein the recess is formed in a bottom surface of the semiconductor device.

4. The MEMS package of claim 1, wherein the damping fluid is pressurized within the cavity, and wherein a pressure within the cavity is between about 1 atmosphere and about 5 atmospheres.

5. The MEMS package of claim 1, wherein a pressure within the cavity is below one atmosphere pressure.

6. The MEMS package of claim 1, wherein the damping fluid is sulfur hexafluoride (SF6), neon, nitrogen, Argon, or Xenon, a hydrocarbon oil, heptane, a lubricant, or Fomblin pump oil.

7. The MEMS package of claim 1, wherein the damping fluid comprises a hydrocarbon oil having a viscosity in a range of about 1 centistoke (cSt) to about 100 centistokes.

8. The MEMS package of claim 1, wherein the damping fluid comprises a hydrocarbon oil that is optically transparent to an optical communication laser.

9. The MEMS package of claim 1, further comprising a cap covering an opening of the cavity, and wherein the cap is bonded to an upper surface of the semiconductor device with a bonding material.

10. A method of mounting a magnet assembly, comprising:
    forming a recess in a semiconductor device containing a microelectromechanical systems (MEMS) micro-mirror;
    seating a magnet assembly within the recess of the semiconductor device;
    positioning the semiconductor device and the magnet assembly within a cavity of a package; and
    inserting a damping fluid in the cavity of the package.

11. The method of claim 10, wherein the MEMS micro-mirror is one of a plurality of micro-mirrors within a MEMS micro-mirror array.

12. The method of claim 10, wherein the recess is formed in a bottom surface of the semiconductor device.

13. The method of claim 10, wherein the magnet assembly partially protrudes from the recess when seated within the recess.

14. A MEMS package, comprising:
    a cavity formed within a package body;
    a semiconductor device disposed within the cavity and including a microelectromechanical systems (MEMS) micro-mirror;
    a damping fluid disposed within the cavity and at least partially surrounding a portion of the MEMS micro-mirror; and
    a magnet assembly disposed within the cavity, the magnet assembly seated within a recess in a bottom portion of the semiconductor device, at least partially surrounded by the damping fluid, and magnetically coupled to the MEMS micro-mirror.

15. The MEMS package of claim 14, wherein the damping fluid within the cavity is pressurized below one atmosphere.

16. The MEMS package of claim 14, wherein the MEMS micro-mirror is one of a plurality of MEMS micro-mirrors within a MEMS micro-mirror array.

17. The MEMS package of claim 14, wherein the cavity is sealed by securing a cap in place with a bonding material.

18. The MEMS package of claim 14, wherein the damping fluid comprises a hydrocarbon oil, the hydrocarbon oil having a viscosity in a range of about 1 centistoke (cSt) to about 100 centistokes and optically transparent to a laser having a wavelength of about 1550 nanometers.

* * * * *